(12) United States Patent
French et al.

(10) Patent No.: US 7,049,932 B2
(45) Date of Patent: May 23, 2006

(54) CONTROL SYSTEM

(75) Inventors: James French, Newmarket (GB);
William White, Pamber Heath (GB);
Michael Brading, Reading (GB);
Rizwan Ahmad, W. Orange, NJ (US);
Richard Anthony Connell, Newmarket (GB)

(73) Assignee: BLP Components, Limited, Newmarket (GB)

( * ) Notice: Subject to any disclaimer, the term of this patent is extended or adjusted under 35 U.S.C. 154(b) by 146 days.

(21) Appl. No.: 10/743,995

(22) Filed: Dec. 22, 2003

(65) Prior Publication Data

US 2005/0134430 A1    Jun. 23, 2005

(51) Int. Cl.
*G08B 5/22* (2006.01)
*H04Q 7/00* (2006.01)
*G05D 11/00* (2006.01)

(52) U.S. Cl. ............. 340/7.1; 340/870.02; 340/870.07; 340/310.11; 340/310.18; 700/286; 700/292; 702/62

(58) Field of Classification Search ............... 340/7.1, 340/870.07; 700/295
See application file for complete search history.

(56) References Cited

U.S. PATENT DOCUMENTS

| 5,640,153 | A | * | 6/1997 | Hildebrand et al. | ......... 340/7.1 |
| 5,761,083 | A | * | 6/1998 | Brown et al. | ............... 700/296 |
| 6,346,890 | B1 | * | 2/2002 | Bellin | .................... 340/825.52 |
| 6,633,823 | B1 | * | 10/2003 | Bartone et al. | ............... 702/57 |
| 6,828,695 | B1 | * | 12/2004 | Hansen | ........................ 307/31 |
| 6,832,135 | B1 | * | 12/2004 | Ying | ........................... 700/295 |
| 2002/0196124 | A1 | * | 12/2002 | Howard et al. | .............. 340/7.1 |

* cited by examiner

*Primary Examiner*—Donnie L. Crosland
(74) *Attorney, Agent, or Firm*—Barnes & Thornburg LLP

(57) ABSTRACT

In a system for remotely controlling the supply of electric power to customer premises, each customer premises is fitted with a power-switching arrangement coupled to a paging receiver (5-1, 5-2, 5-3). A utility company supplying the electric power can input requests to a server (1), optionally via a terminal (2) or a network link (3). A software application running on the server generates a control instruction in response to a request and sends it to a paging service (4) for transmission over a paging network. When a paging message is received at one of said customer-premises paging receivers, if the control instruction is appropriately addressed the power-switching arrangement will put it into effect, for example to connect or reconnect the customer premises power supply.

47 Claims, 22 Drawing Sheets

| X-Pulse △ XP SYSTEM CONTROLLER | | Power & Utilities |
|---|---|---|
| Utility: Energy One | User Name: D Sadler | Monday October 27th 2003 |

Import Customers - Request

Select the file you wish to upload. Only *.csv files are accepted. These will be checked by the BLP System Administrator and then loaded into the database.

Important: The format of the .csv file can be found at the following location X-Pulse help. Please check that the .csv file conforms to these rules before upload. This will help to save time in processing your request.

File Name: [_____] [Browse]

Options ◉ Overwrite duplicate files
○ Keep duplicates names

Commands
[ Load ]

Message Center
Queue empty.

Customers
Search
Add
Import

Groups
List
Add

Queue
Connect
Disconnect

Admin
Password
Users
Customize

Reports
Log

Quit
Logout

Fig 8

| X-Pulse XP SYSTEM CONTROLLER | | | | Power & Utilities | |
|---|---|---|---|---|---|
| Utility: Energy One | User Name: D Sadler | | | | Monday October 27th 2003 |

Customers
Search
Add
Import

Groups
List
Add

Queue
Connect
Disconnect

Admin
Password
Users
Customize

Reports
Log

Quit
Logout

User List

| Group name | Group ID | | |
|---|---|---|---|
| Load control | +BG13579 | Delete | Select |
| Shut down | +BG20549 | Delete | Select |

Commands
Back

Message Center
Queue empty

Fig 9

X-Pulse XP SYSTEM CONTROLLER     Power & Utilities

Utility: Energy One    User Name: D Sadler    Monday October 27th 2003

Message Center
Queue empty

Customers
Search
Add
Import

Groups
List
Add

Queue
Connect
Disconnect

Admin
Password
Users
Customize

Reports
Log

Quit
Logout

Add group

Name: _____

The group ID is a 8 character alphanumeric string. The first three characters are fixed by the software; the last 5 can be any alphanumeric character. The Group ID is case sensitive Group ID: _____
Description: _____

Enable autoclose: ☐
Group ID: 0

Commands
Save
Back

Fig 10

| X-Pulse / XP SYSTEM CONTROLLER | | Power & Utilities |
|---|---|---|
| Utility: Energy One | User Name: D Sadler | Monday October 27th 2003 |

Customers
Search
Add
Import

Groups
List
Add

Queue
Connect
Disconnect

Admin
Password
Users
Customize

Reports
Log

Quit
Logout

Customize

Up to five extra fields can be added to the customer details. Please enter the files you would like for these fields below.

Field 1
Field 2
Field 3
Field 4
Field 5

Commands
Load

Message Center
Queue empty

Fig 15

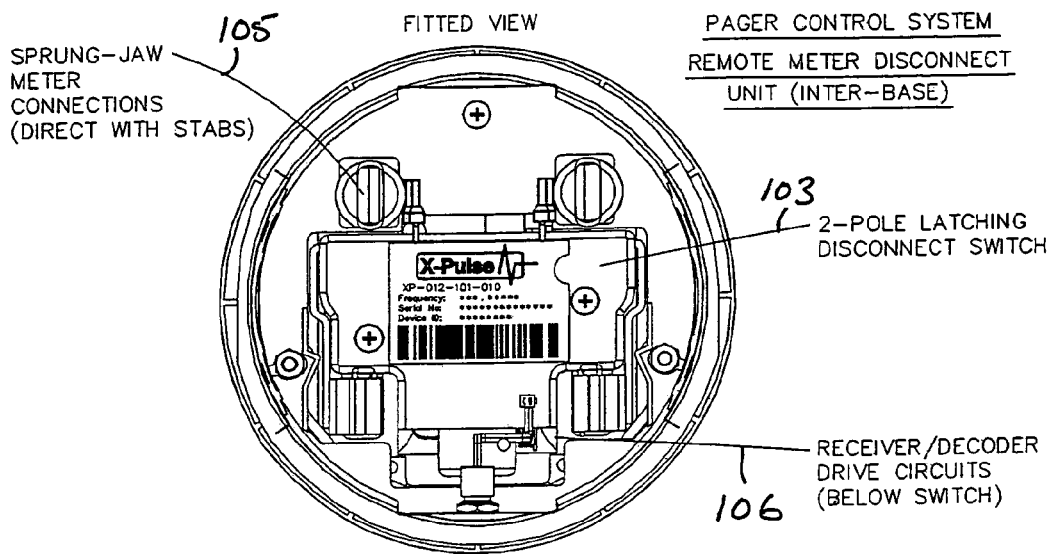
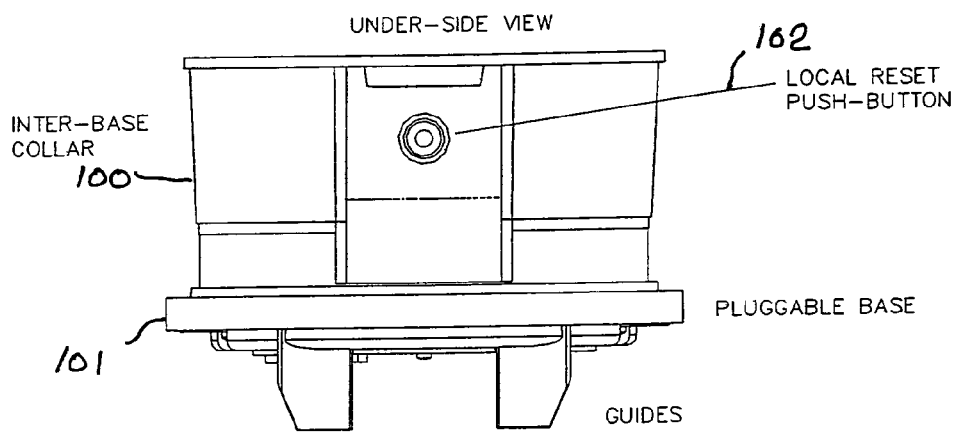
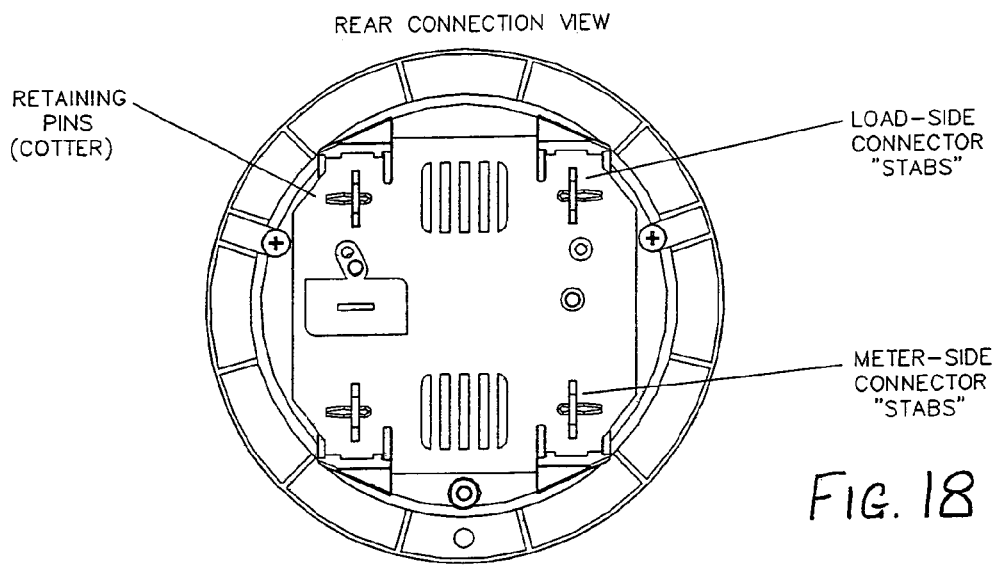
FIG. 18

CONTROL SYSTEM

BACKGROUND OF THE INVENTION

The invention relates to a system for remotely controlling power at a plurality of customer premises and to a controller for use in such a system at customer premises. In particular the invention relates to a system whereby control instructions on which a controller at the customer premises acts are transmitted from a central location to the individual controllers by means of a paging network. Thus, each individual controller includes a paging receiver for receiving control instruction for acting upon at the customer premises.

Remote control systems are known that are capable of generating and transmitting control signals to remotely control electrical equipment. Electric utility companies utilise a private remote control system with a private radio network to remotely control on/off switching of capacitor banks in accordance with daily electric power requirements. Such systems are however expensive in that they require the creation and maintenance of a private radio network.

BRIEF SUMMARY OF THE INVENTION

According to one aspect of the invention there is provided a remotely controlled controller for an electricity supply contained within a meter or an adapter arranged to be mounted between a demountable meter and a supply socket, the controller comprising:

a temperature compensated paging receiver;
 a decoder for decoding control messages received via the paging receiver;
 the paging receiver and/or decoder having a unique address identifying an individual controller;
 a power switch for connecting and/or disconnecting power between the supply socket and a load; and
 a control arrangement for receiving decoded messages from the decoder and arranged to act upon control instructions included in the decoded messages to cause the power switch to connect or disconnect the supply socket to/from the load: wherein said messages have the format—a first set of ASCII check sum characters, followed by a second set of ASCII sub address characters, and a third set of ASCII command message characters.

The controller may be contained within a meter supply adaptor arranged to be mounted between a demountable meter and a supply socket. When so contained the switching arrangement for connecting between the supply socket and the load may generate substantial amounts of heat and at typical full load the switching arrangement can generate sufficient heat to result in a temperature rise in the order of 30NC within the adaptor. In addition these adaptors may be mounted externally of the customer premises and thus the temperature range over which the controller is required to operate is extended from ambient, which may be considerably below 0° C. to 30° C. above the ambient on a hot summer=s day. The controller may be required to operate over a wide temperature range, typically −40° C. to +85° C.

It is known to compensate for this effect by providing within the adaptor a cooling fan and a heating element so that the temperature range within the adaptor can be constrained to a much smaller range of temperatures. This, however, is a relatively expensive solution and requires additional space within the adaptor to fit the heating element and cooling fan.

Paging receivers are not currently available that have an extended temperature range and consequently the provision of heating and/or cooling within the adaptor has been necessary. In a system according to the present invention the paging receivers are temperature compensated so that they will work over an extended temperature range, for example between minus 40EC and plus 85EC.

Any appropriate conventional paging system or network may be used. Examples include the FLEXJ, POCSAG (Post Office Code Standard Advertising Grant) and ERMESJ protocols. By way of example, however, the invention will be described primarily with reference to the FLEX protocol.

The over air protocol/message structure is preferably designed to provide a high level of security, to expand the allowable address range of the paging protocol used with the inclusion of sub-addresses, to reduce false activation to an insignificant level, to provide a high level of corrupt message detection, and to provide flexible structure for future expansion. For use with the FLEX protocol, and optionally with other paging protocols, the message structure comprises a first set of six ASCII characters, a sub-address of eight ASCII characters and a variable length string of command characters. The number of command characters is open and in a particular embodiment to be described has a maximum number of allowable characters of ten, giving a total message structure length of 24 ASCII characters. The sub-address may be considered as a further identifier over and above the normal FLEX paging RIC/CAP code address. This sub-address consists of eight ASCII characters, which may include spaces to maintain the structure. Any printable characters may be used including upper case and lower case letters.

The controllers may contain two sub-addresses, one of which is used as an individual address and one as a group address. The primary sub-address is designed as an address that is unique to a controller. The secondary, group, address may be designed to be common amongst a group of devices. This secondary address may be changed by means of messages sent over the paging system. This may be achieved my sending the appropriate command to the primary sub-address. This is designed to allow control of a group of devices from a single group address transmission and the possibility of an individual device to be programmed over the air to change groups. If no secondary address is required, then the secondary address may be set to be the same as the primary address.

The command message is a variable length string of characters used to identify the command that is to be carried out. In the embodiment to be described it has a maximum length of ten characters but fewer or more message characters could be employed with appropriate modifications to the design.

A check sum is employed in addition to the FLEX error detection and correction to minimise the possibility of accidental or malicious false decoding of a message. This does mean, however, that reception of messages may not be as good as with a stand alone pager where no check sum is used, as the message has to be received without any errors for it to be acted upon. The check sum precedes all messages and contains six ASCII characters ranging from 20 to 2Fhex. The numerical value of these characters is based on the message content so that each sub-address and command will generate different check sum values. In addition the check sum algorithm has been arranged to maximise unique results in the check sum field in cases of typical burst errors, such as are encountered via asynchronous data links.

The check sum may be calculated according to a method having the following steps:
  a) add together the ASCII value of each odd character position starting with the first character of the second set and continuing to the end of the third set,
  b) truncate the result to 12 binary bits if necessary (FFF hex),
  C) starting with the most significant nibble of the 12 bit value calculated in Step b), function OR this value to 30 hex after bit shifting the nibble to the least significant position to produce the first check sum character,
  D) repeat the step c) for the last two nibbles to produce the second and third check sum characters,
  e) add together the ASCII value of each even character position starting with the first character of the second set and continuing to the end of the third set,
  F) truncate the result to 12 binary bits if necessary (FFFhex),
  G) repeat steps c) and d) using the result from step f) instead of step b) to produce the final three characters of the check sum.

Typical command messages may be to open the switch, arm the switch, close the switch, clear any current limit, set a current limit to a specific value, or change secondary sub-addresses to a new one specified in the message.

Thus, one of the control messages may define a maximum load availability and the controller may cause the switching arrangement to disconnected the power when the maximum load is exceeded. The controller may have a manual reset switch which is operable to cause the switching arrangement to close to restore the power. The operation of the manual reset may depend on a release signal being received via the paging receiver to prime or arm the reset switch.

In a particular embodiment of the invention the controller may be arranged to reconnect the power at a given time interval after a disconnection. The given time interval may be programmable by means of messages received via the paging receiver.

Various other local interlocks may be provided. It has been known for attempts to be made to bypass a disconnected meter by temporarily connecting a heavy duty cable between the disconnected premises load and the neighbours supply. An unauthorised and highly dangerous situation. It is possible that two adjacent premises are fed with two different phases from the utility=s three phase electricity distribution system, in which case a catastrophic fault condition could result if power reconnection is made on the disconnected unit while cable linked to a neighbours supply. In order to prevent this potentially dangerous situation the controller will check the supply phase relationship on the disconnected premises switch open contacts before completing a close action. If an undesirable AC voltage is present on the open contacts, an assumption is made that an unauthorised connection has been made to an adjacent supply. In this case the switching arrangement is inhibited from operation and even manual reset attempts by the customer are ineffective. In a further aspect the invention provides a system for remotely controlling the supply of electric power to customer premises comprising:
  a central control computer programmed to produce control instructions for transmission to a controller contained within a meter or an adapter located between a supply socket and a demountables meter at at each customer=s premises, each controller having a unique identifier or belonging to a group with a single common unique identifier; wherein the central computer is programmed to produce a command message having the format—a first set of ASCII check sum characters, followed by a second set of ASCII sub address characters, and third set of ASCII command message characters, and
  a paging system for transmitting the command message from the central control computer to each controller; wherein
  each controller comprises a temperature compensated paging receiver, a decoder for decoding command messages addressed to that controller, a switching arrangement for connecting and/or disconnecting the supply socket to/from a load, and a control arrangement for receiving control messages from the decoder and arranged to act upon the instructions to cause the switching arrangement to connect or disconnect the supply socket to/from the load.

Such a system allows the remote switching of power at a customer=s premises from a central location using a paging infrastructure that is already in existence. This enables a Utility to implement a system without the expense of providing the communications infrastructure.

In general, the use of an existing paging infrastructure may advantageously provide a very low entry cost for implementing a system embodying the invention, and a very low operating or use cost for the system. By contrast if a Utility were to set up its own communications infrastructure or use other existing communications methods, much higher costs would be anticipated.

The system has additional error protection to that provided by the paging network to maintain security of supply and reduce the possibility of corrupted messages being acted on by the controllers.

In a still further aspect the invention provides a system for controlling the supply of electric power to customers of a utility supply company comprising providing a data centre through which a Utility can make changes thereto, for example by connecting or reconnecting its customers=supply. A utility=s customer service operative is able to access the data centre, for example from a computer workstation, to trigger the generation of control messages for effecting a change in customer supply, transferring the messages to a paging service provider to cause said messages to be transmitted to a paging receiver contained within a remote controller at the customer=s premises, said messages when received by said controller being effective to cause the controller to effect the function contained in the message.

Thus the Utility supplier can sub-contract the sending of control messages to the controllers to operators of a data base containing customer details. This operator may also run a call centre for the Utility through which its customers can make requests for supply or changes in the terms of supply, or notify changes of details, for example a new customer at an existing premises.

The Utility may communicate with the data centre in any of a variety of ways. For example, the Utility=s operatives may be able to access a software application running at the data centre directly through a network connection or over a suitably secure internet link. Alternatively, they may send messages to staff at the data centre for entering information or requests to the software application.

The Utility may also be able to transmit information to the data centre to update customer information in the data base.

In a further embodiment, a single data centre may be able to serve more than one utility company and their respective customers.

In a still further aspect the invention provides a message structure for sending commands to a remote controller, the message structure comprising a first set of ASCII check sum characters, followed by a second set of ASCII sub address characters, and third set of ASCII command message characters.

Such a message structure gives an added degree of error protection to that provided by the paging system, but does result in some messages not being received and acted upon. To reduce this possibility the messages may be repeated a number of times, the number being selected to provide the desired level of confidence that messages will be correctly received under the designed communication link properties.

The check sum calculation may perform the following steps:
a) add together the ASCII value of each odd character position starting with the first character of the second set and continuing to the end of the third set,
b) truncate the result to 12 binary bits if necessary (FFF hex),
C) starting with the most significant nibble of the 12 bit value calculated in Step b), function OR this value to 30 hex after bit shifting the nibble to the least significant position to produce the first check sum character,
D) repeat the step c) for the last two nibbles to produce the second and third check sum characters,
e) add together the ASCII value of each even character position starting with the first character of the second set and continuing to the end of the third set,
F) truncate the result to 12 binary bits if necessary (FFFhex),
G) repeat steps c) and d) using the result from step f) instead of step b) to produce the final three characters of the check sum.

A check sum calculated in this manner is arranged to maximise unique results in the case of typical burst errors such as are encountered in asynchronous wireless data links.

BRIEF DESCRIPTION OF THE SEVERAL VIEWS OF THE DRAWINGS

The above and other features and advantages of the invention will be apparent from the following description, by way of example, of an embodiment of the invention with reference to the accompanying drawing, in which:

FIGS. 4–17 illustrate typical users screens of the user interface for generating messages to be sent to the controllers, FIG. 18 shows plan elevation and underside views of an adapter for insertion between a supply socket and a meter, the adapter housing a controller according to the present invention.

DETAILED DESCRIPTION OF THE INVENTION

Figure 1:
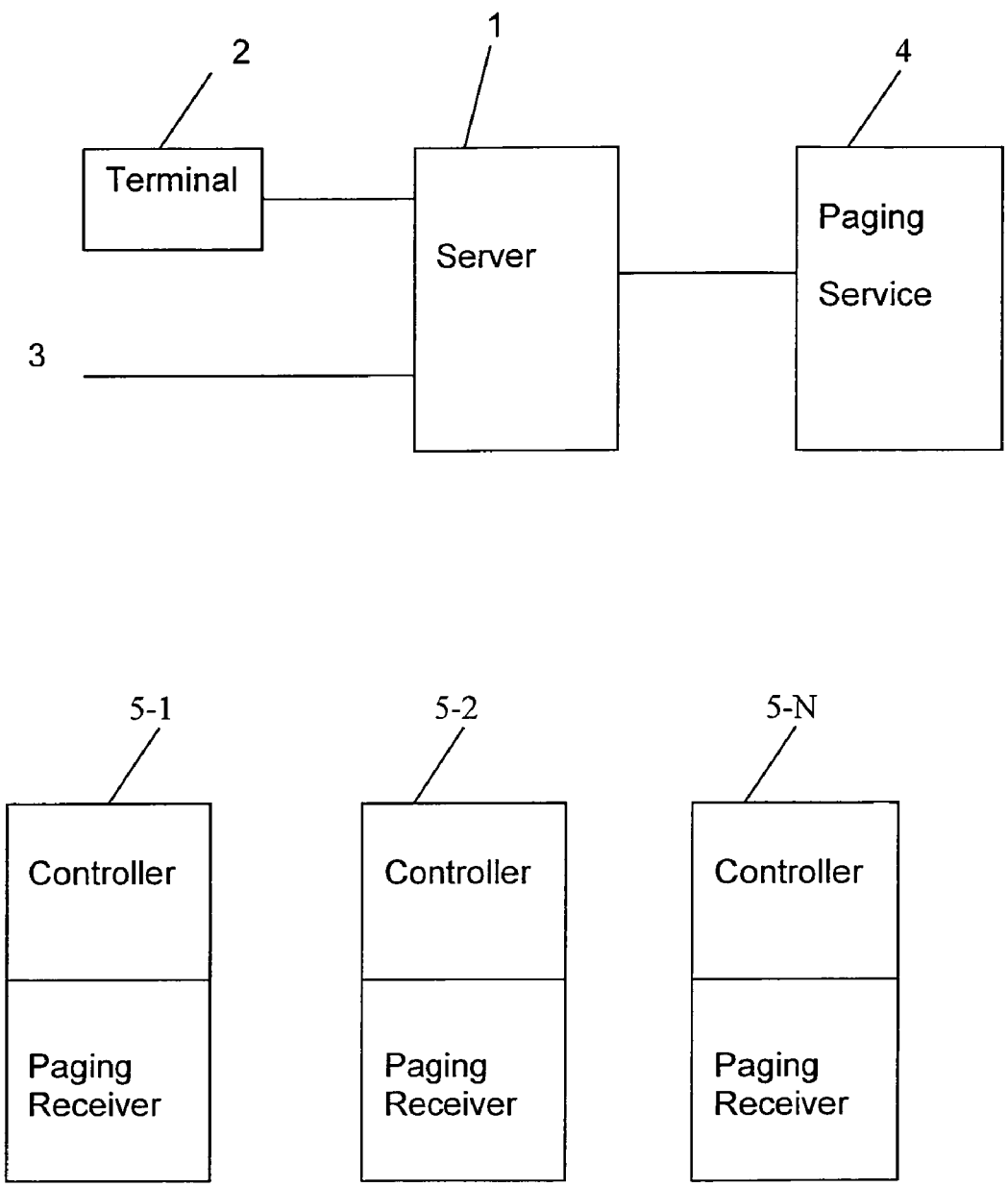
FIG. 1 is a block schematic diagram of a system for remotely controlling power at a plurality of customer premises according to the present invention.
Figure 2:
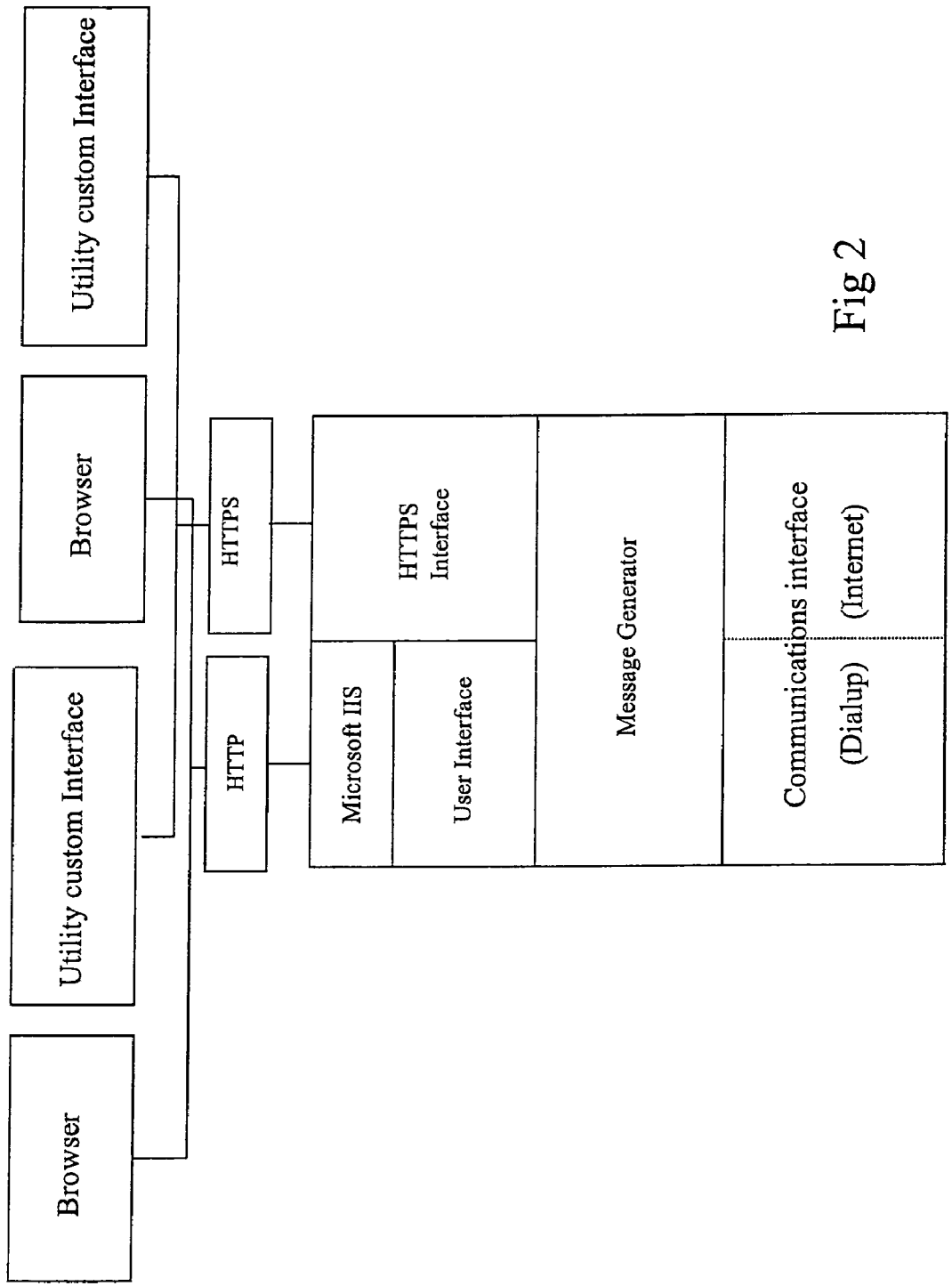
FIG. 2 is a schematic drawing of a server and user interface for use in the system of FIG. 1.

FIG. 1 shows in block schematic form an embodiment of a system for remotely controlling power at a plurality of customer premises according to the invention. As shown in FIG. 1 the system comprises a server 1, which is arranged to hold details of customers and their conditions of supply and to generate messages for controlling the operation of the controller at the customer=s premises. Data may be entered into the server 1 via a terminal 2 which is typically a personal computer. Alternatively, or in addition, the data may be entered remotely via a connection to an input 3. This connection maybe either via the internet, via a dial up connection over the public switched telephone network or via a private circuit. Thus the server 1 may be situated remote from the electricity utility company, who may be able to enter data into the server via a network connection or may download information to the terminal 2 for entry by operators at a call centre that has a access to the server 1.

The server 1 generates appropriate messages for transmission to various controllers at the customer=s premises and forwards those messages to a paging service 4. A plurality of controllers 5-1, 5-2 . . . 5-N, each contain a paging receiver to which messages can be passed by the paging network 4. Each controller 5-1, 5-2 . . . 5-N has a unique address so that messages can be passed to that controller to enable individual control of supply to individual customers. In a modification of the invention a group of controllers may have a single identity so that the utility may initiate load shedding to a group of customers premises with a single command.

Figure 4:
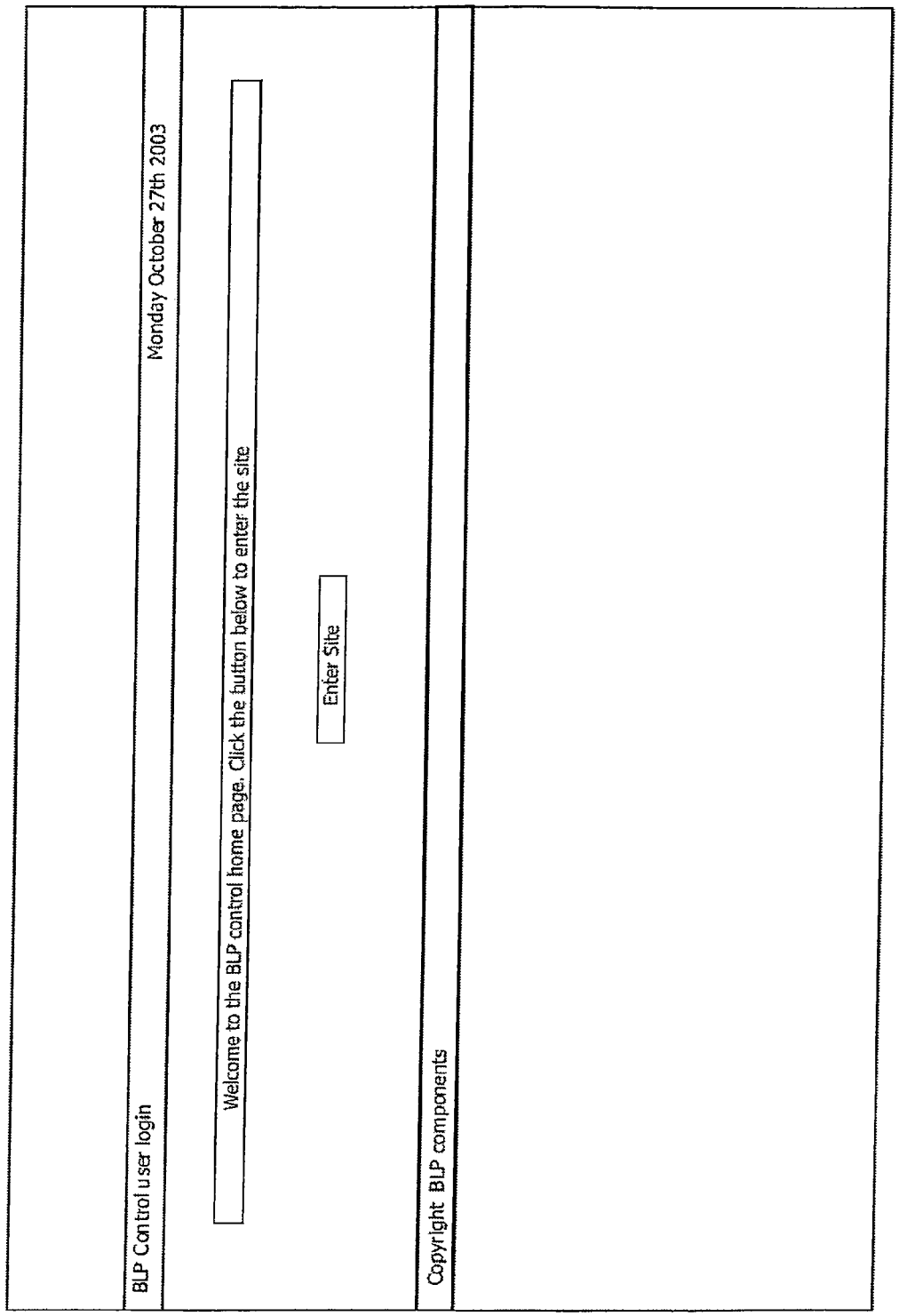
Figure 5:
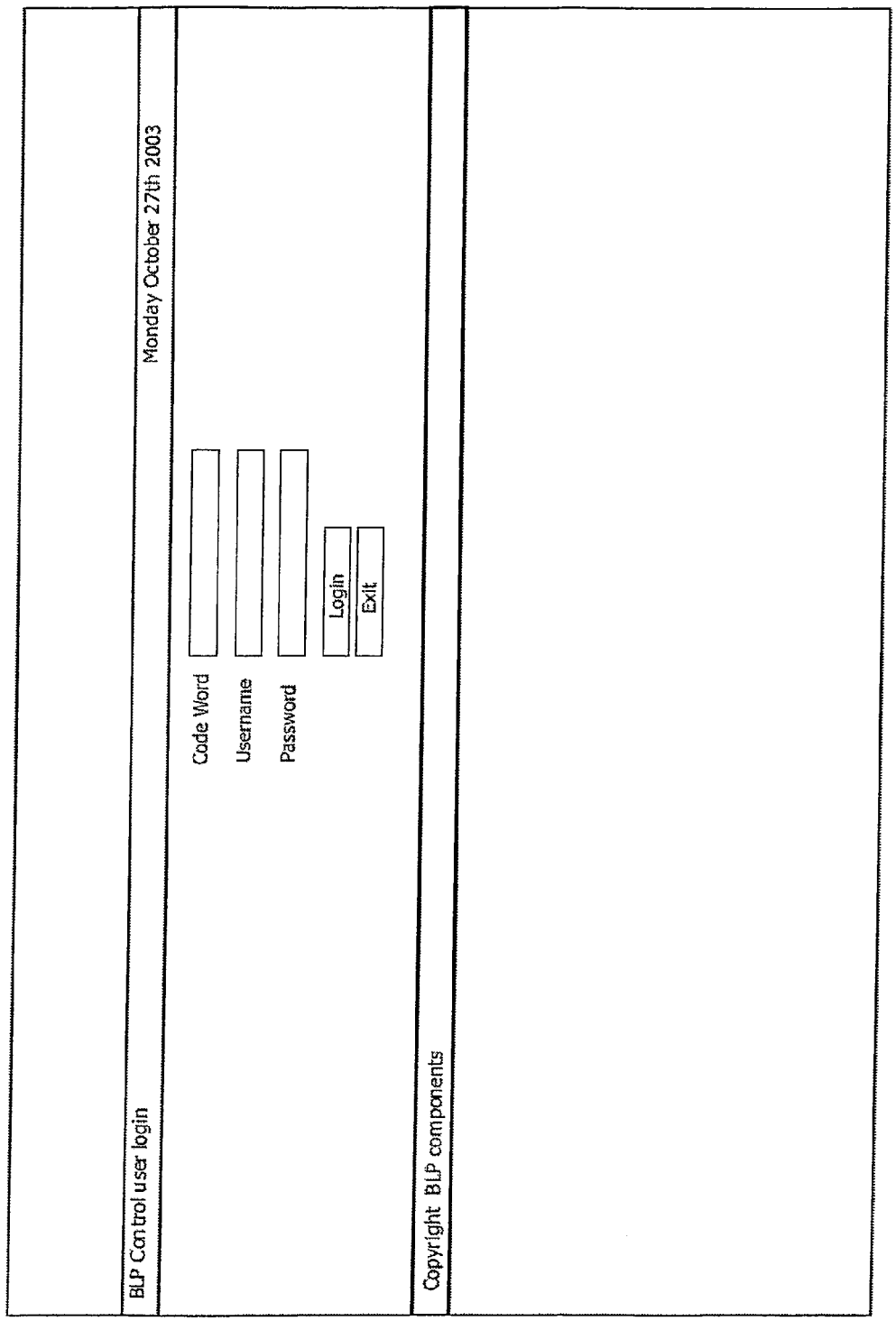
Figure 6:
Figure 7:

The user interface to enable messages to be initiated can be loaded and run as a stand alone application from a personal computer such as terminal 2 in FIG. 1. Alternatively a network version of the user interface can be accessed from a utility work station, that is a work station situated at the supply utility, via a remote server located at a data centre using an internet connection or a dial up connection. The user interface is illustrated in FIGS. 2–17. Stringent security measures are followed before access to generate control messages can be obtained. FIGS. 4–17 show typical user screens for software control commencing from entering the Site to exiting the Site. FIG. 4 shows the first screen that is presented on entering the Site. FIG. 5 shows the login screen where a code word, a user name and a password have to be entered. FIG. 6 illustrates a screen enabling a user to search for a particular customer. FIG. 7 illustrates a screen enabling a user to add a new customer and has boxes for entering the details of the customer. FIG. 8 shows a screen enabling requests from a customer to be loaded into the server.

FIG. 9 shows a screen allowing lists of groups of customers to be displayed and selected or deleted. Thus a group may be selected for load control or shut down when the utility wishes to shed load from customers who have an agreement with them that load can be disconnected for certain periods of a day. A typical application of this is where customers have a separate supply for heating swimming pools. The agreement with the suppliers may provide for a given amount of power to be provided during a 24 hr period but the particular times during which the power is supplied is at the discretion of the utility supplier. The screen shown in FIG. 9 enables the different groups in this category to be listed and hence selected at any particular time for disconnection or re connection of the supply.

Figure 11:
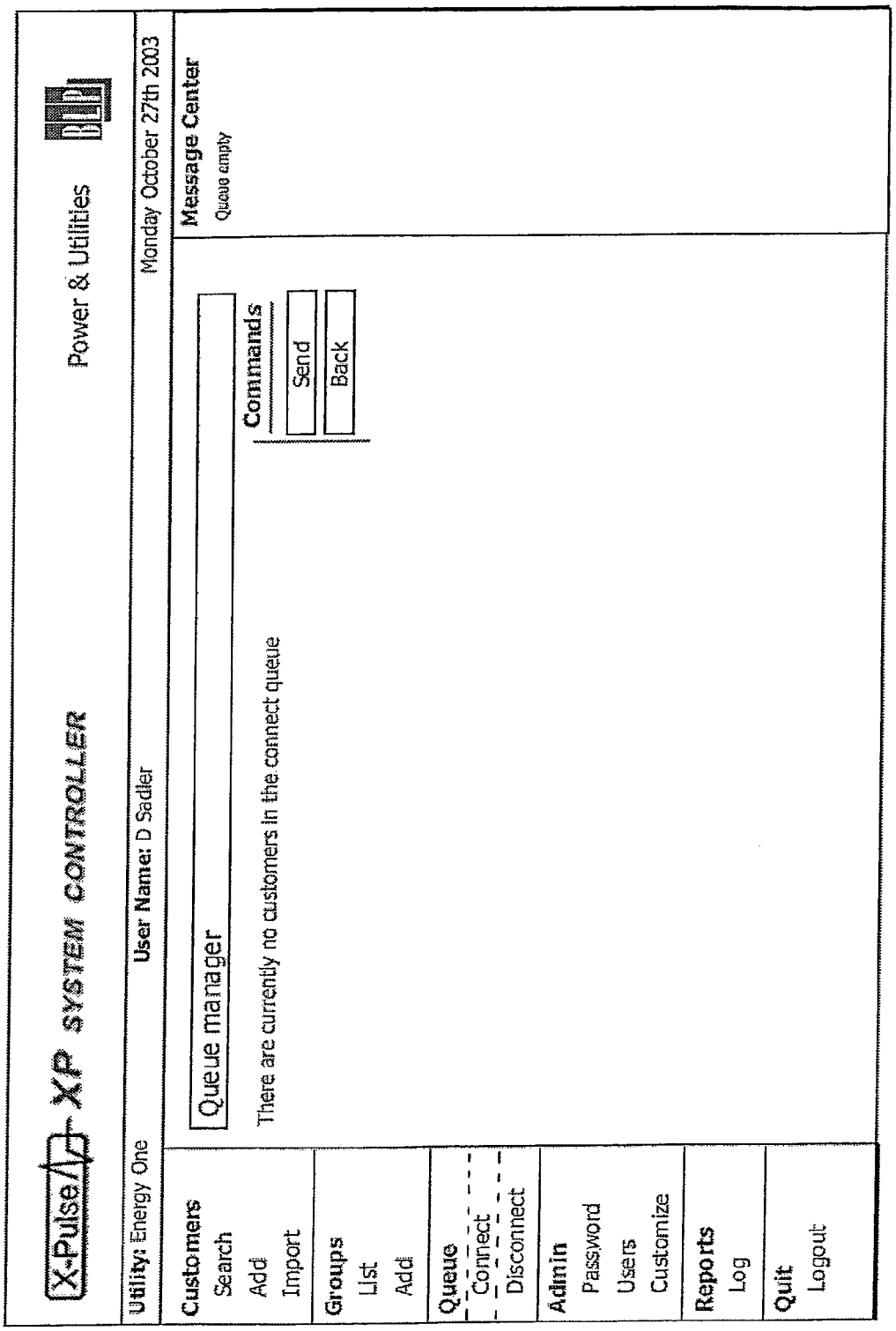
Figure 12:
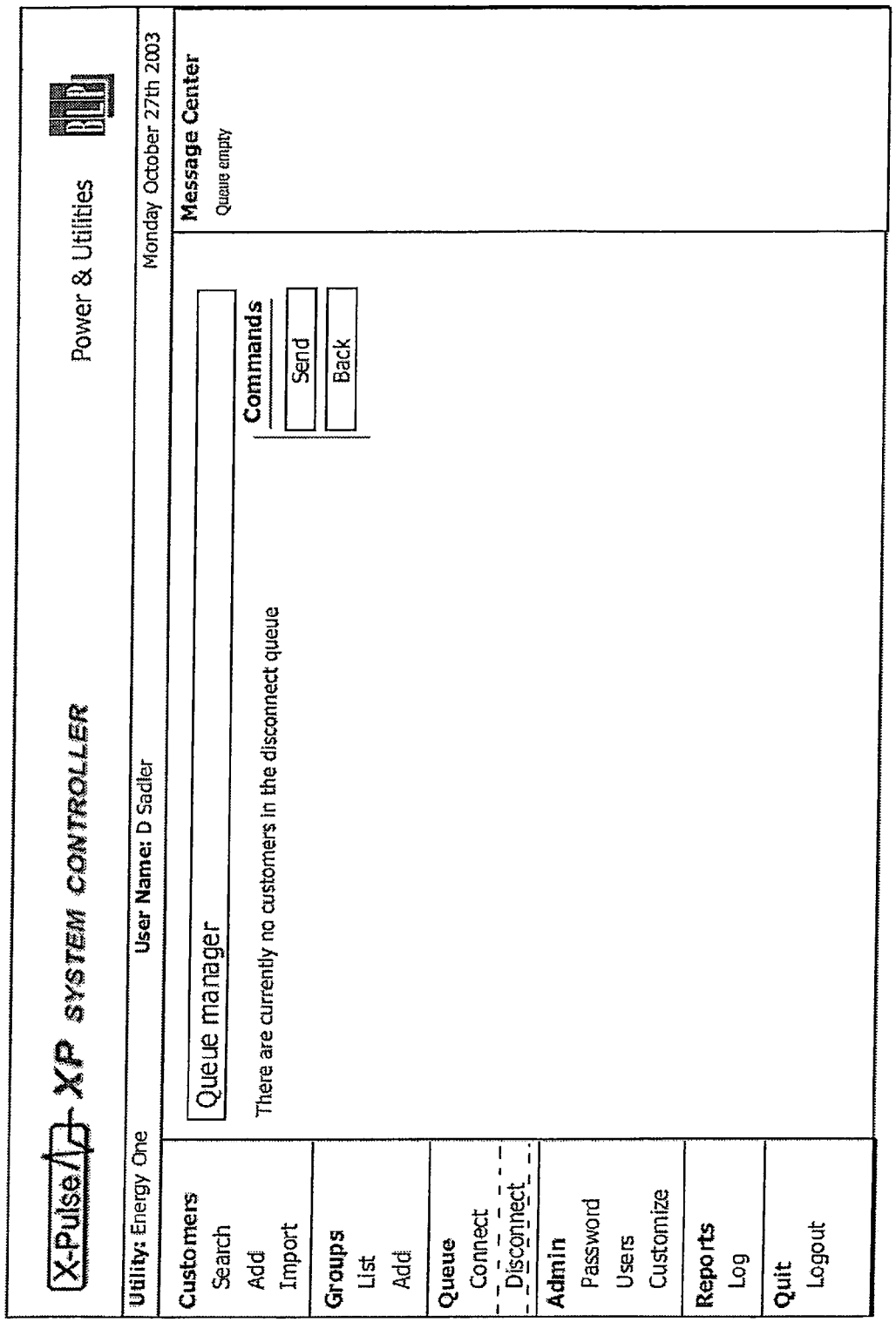
Figure 13:
Figure 14:
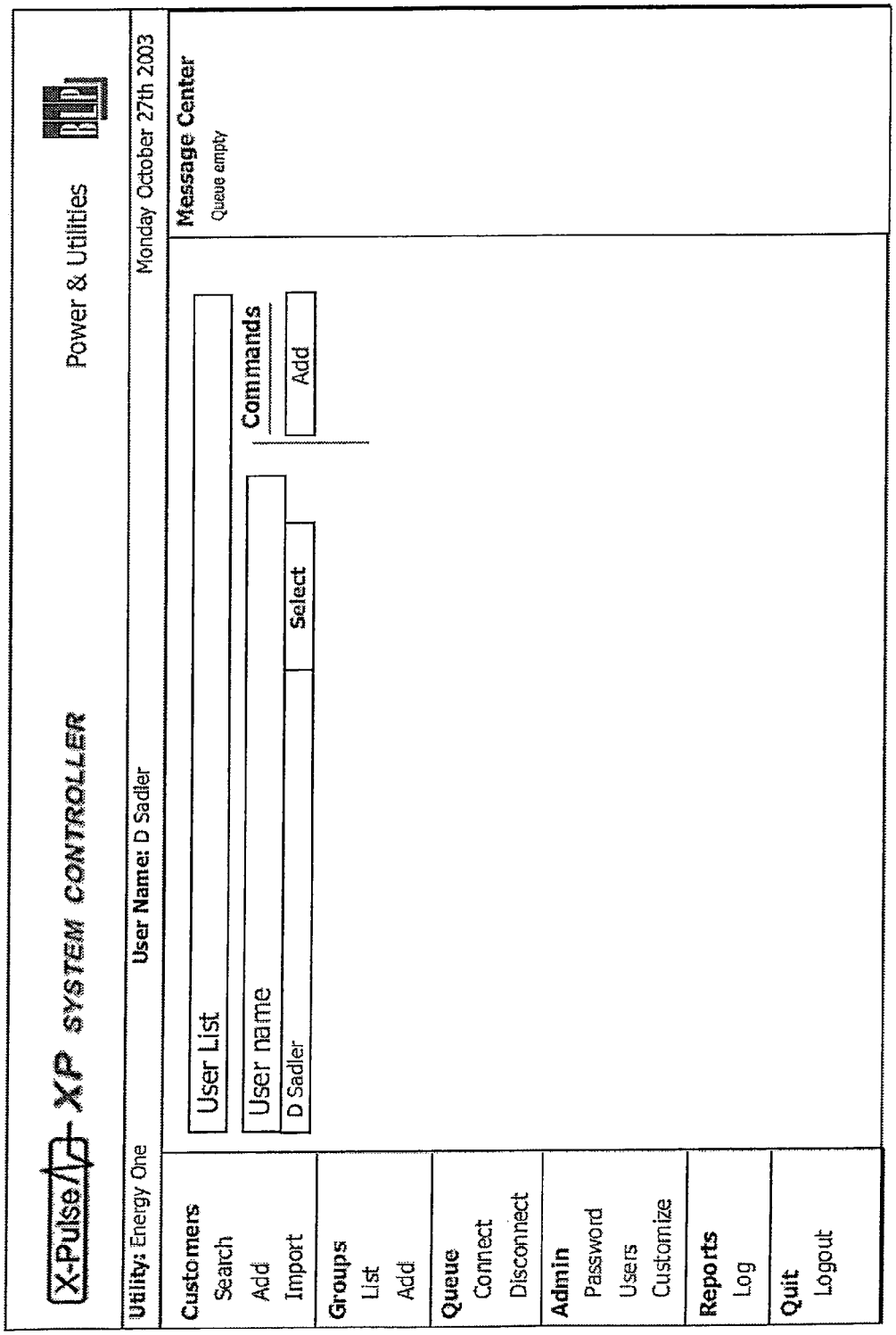
Figure 16:
Figure 17:
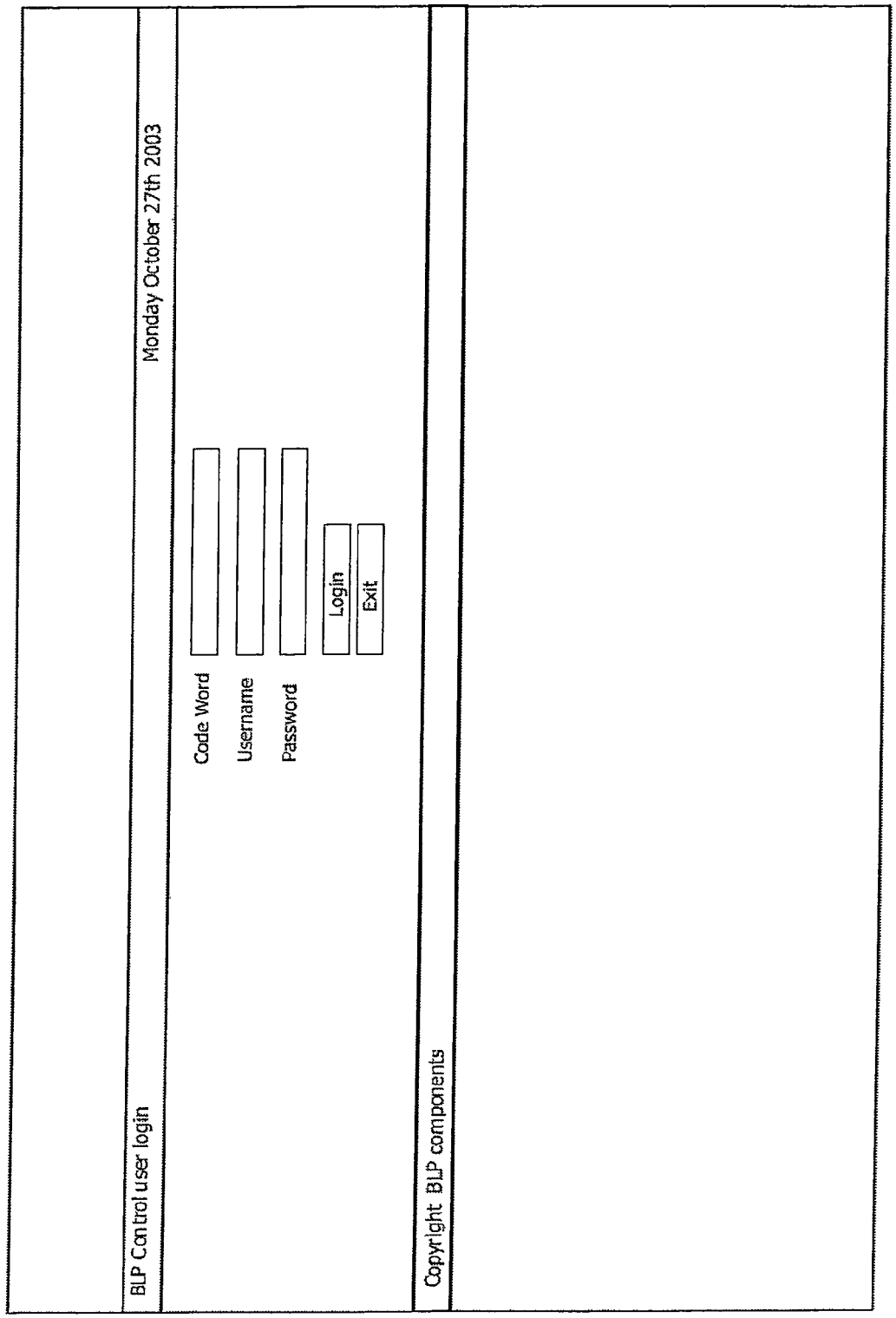

The screen shown in FIG. 10 enables further groups to be added. The screen shown in FIG. 11 is the queue manager which shows the number of customers in the queue to be connected. It will be apparent that the messages have to be sent out in sequence to the customers and a hence queue may be formed while the messages are being transmitted. FIG. 12 shows a corresponding queue manager screen for a disconnect command to customers. FIG. 13 is a screen allowing a user to change their password, typically a password may have to be changed after a given interval to maintain security. FIG. 14 shows a screen enabling users to be added. FIG. 15 is a customising screen which enables a number of extra fields to be added to the customer details. FIG. 16 is a report-log screen which enables a user to log the actions taken for a particular customer and to print out a report of such actions. Finally, FIG. 17 is a log-out screen enabling the user to exit the system.

Figure 3:
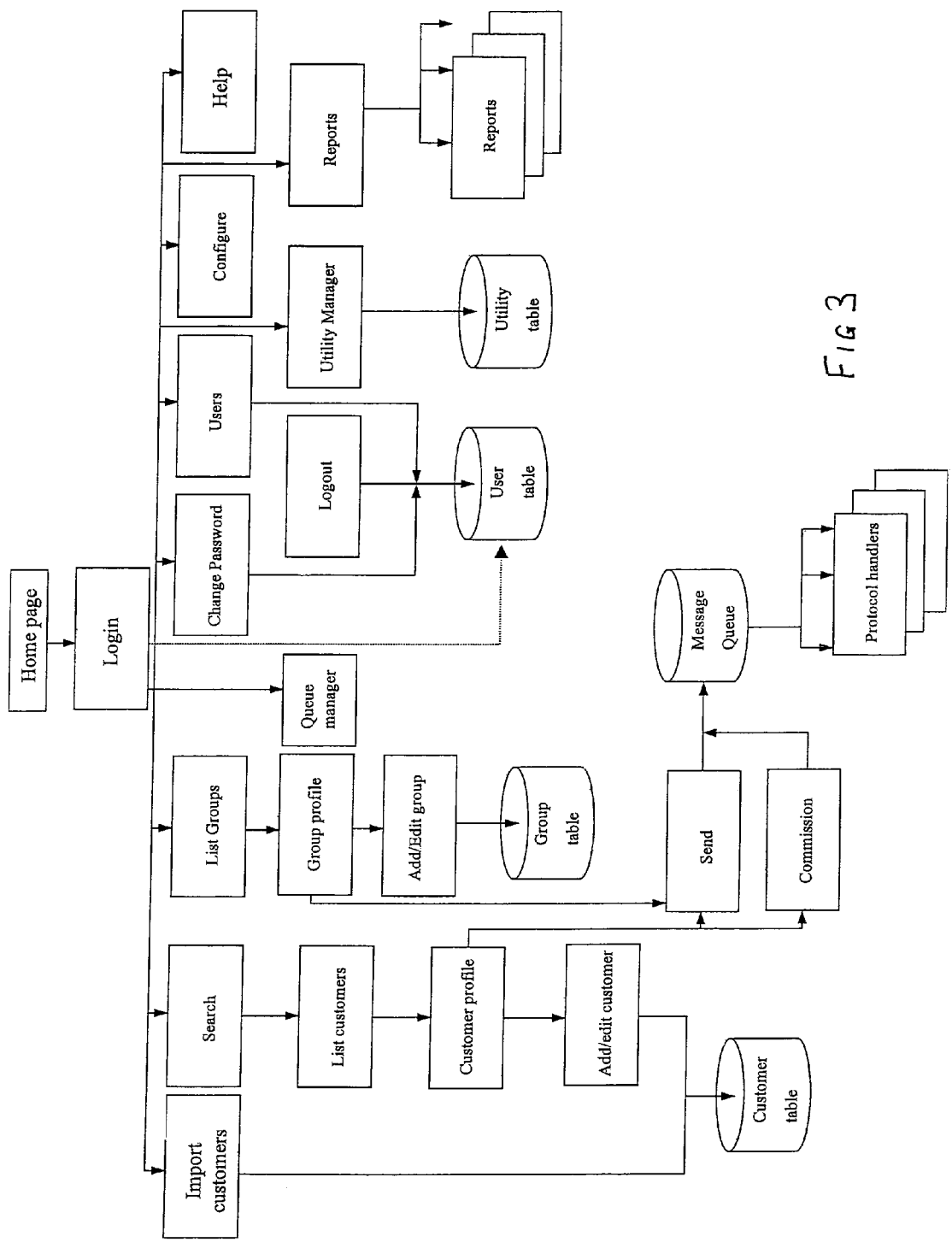
FIG. 3 illustrates a user interface for generating control messages to be transmitted though the system.

FIG. 3 is a flow diagram which illustrates the actions taken in response to interaction with the user interface.

As can be seen (e.g. FIG. 1), the server 1 includes a message generator which generates messages for transmission to the controllers 5 when the utility wishes to connect, disconnect or change the conditions of supply. These messages are fed to a commercial paging network, which typically uses either the FLEXJ protocol or the POCSAG protocol. POCSAG is an acronym standing for Post Office Code Standard Advertising Grant and the protocol is described in CCIR Recommendation 584, Radio Paging Code 1.

Figure 20:
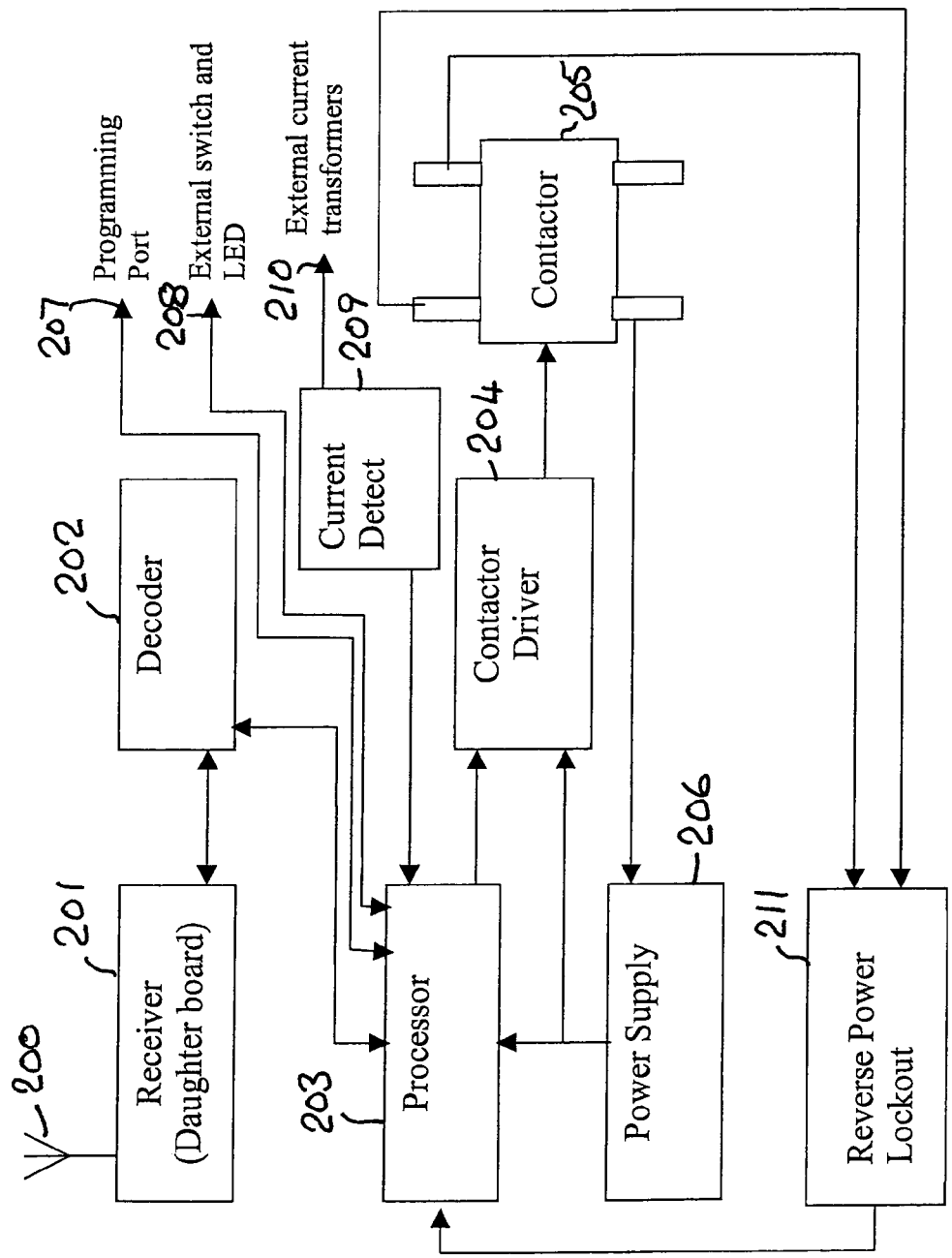
FIG. 20 is a block schematic drawing of a controller according to the invention.

At each customer=s premises there is provided a controller and FIG. 20 shows in block schematic form an embodiment of a suitable controller. The controller comprises a receiver 201 which receives a signal via an antenna 200 from the paging network 4. Thus receiver 201 is a standard paging receiver but has certain modification made thereto in order to enable it to operate over a wider temperature range. The receiver 201 feeds a decoder 202 which checks sub-addresses for individual controllers. A processor 203 is connected to the decoder 202 and is arranged to respond to appropriate commands in received messages in order to drive a contactor driver 204 which operates a contactor (or power switch) 205 to connect the utility supply to a load. A power supply 206 for the controller is fed from the supply side of the contactor 205. The processor has a further input from a programming port 207 which enables the local programming of the processor 203. The processor also receives an input from a terminal 208 which is connected to an external reset switch and light emitting diode (LED) indicator. The processor has a further input from a current detector 209 which is connected via an output 210 to current transformers which sense the load current being taken. A reverse power lockout circuit 211 is provided which monitors the voltage on the load side of the contactor 205 and produces an output which is also connected to the processor 203.

Figure 21:
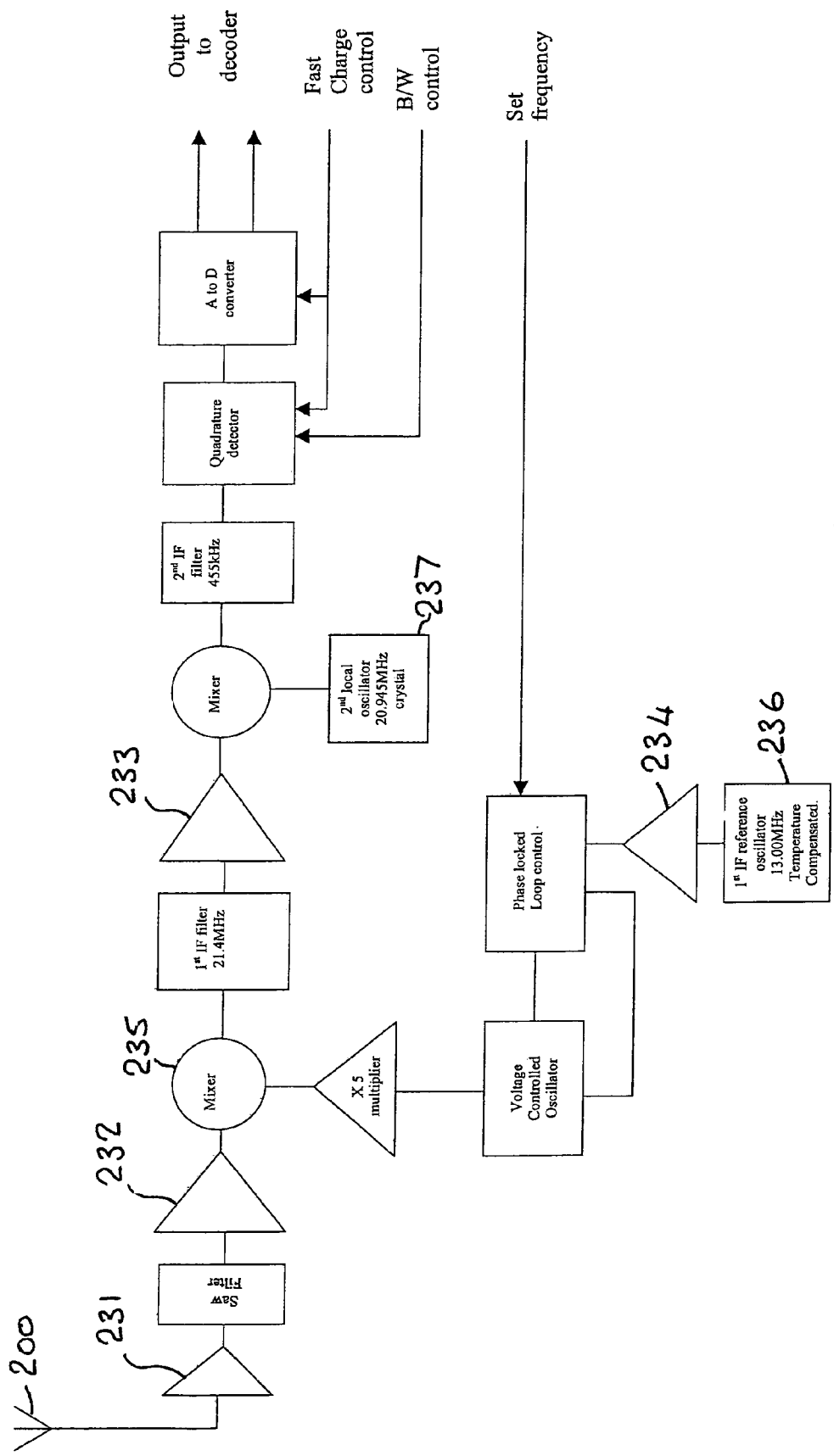
FIG. 21 is a block schematic drawing of a paging receiver for use in the controller shown in FIG. 20.

FIG. 21 shows the receiver 201 of FIG. 20. As shown in the FIG. 21 the circuit is a standard paging receiver but it has been modified in certain respects in order to extend the temperature operating range. Amplifiers 231, 232, 233 and 234 and mixer 235 have had their working voltage increased to enable them to operate at the temperature extremes. The phase lock loop control chip has been modified by replacing the internal reference crystal oscillator by a temperature compensated crystal oscillator 236. The receiver could be further compensated by replacing the second local oscillator 237 by a temperature compensated crystal oscillator.

Figure 22:
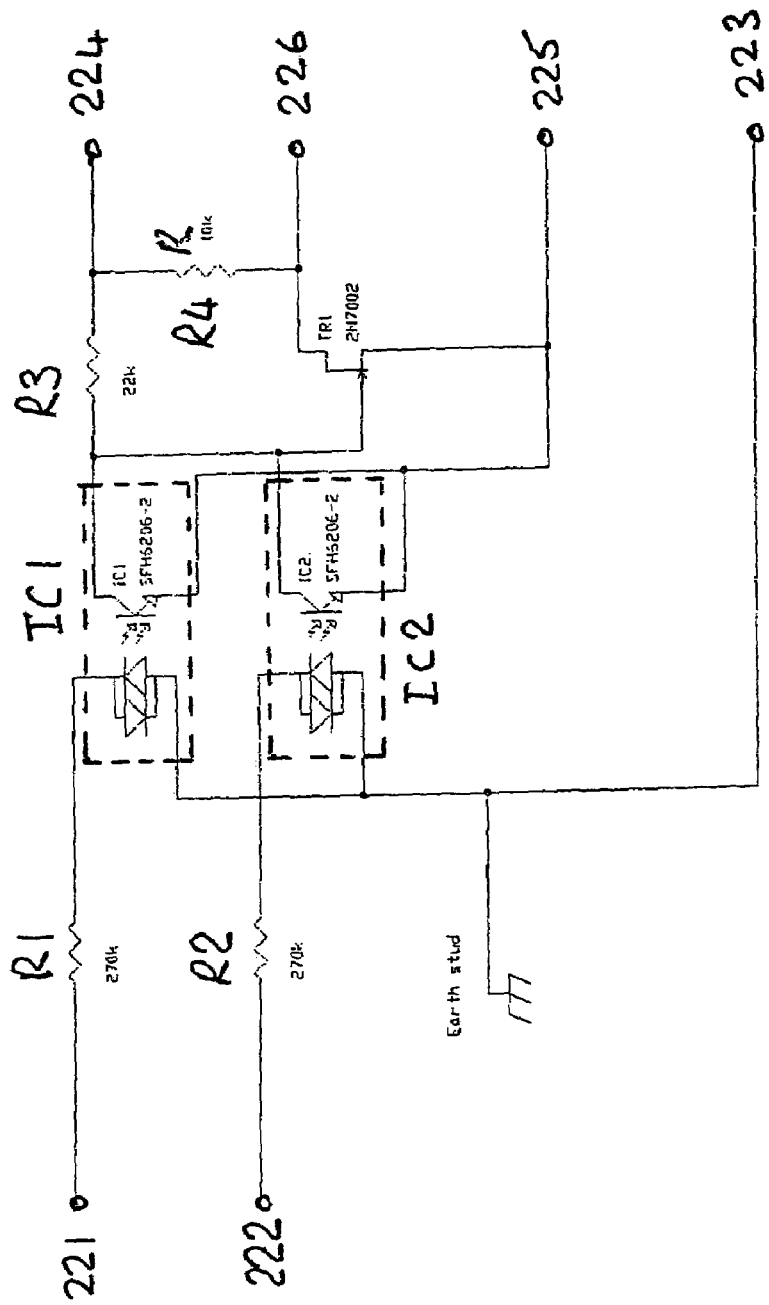
FIG. 22 shows a reverse power lockout circuit for use in the controller of FIG. 20.

FIG. 22 shows the reverse power lockout circuit which is provided to prevent the contactor being closed should a fault condition exist on the load side of the contactor indicating that an unauthorised condition is present at the load terminals. As shown in FIG. 22 the reverse powerlock out device has first and second input terminals 221 and 222 which are connected to the load side terminals of the contactor 205. These feed to opto couplers IC 1 and IC 2 via two resisters R1 and R2. The other end of the input side of the opto couplers is connected to an earth terminal 223. A terminal 224 is provided to enable a low voltage power supply to be applied to the output side of the opto couplers IC 1 and IC 2, the other end of the output side being connected to a ground 225. A resistor R3 is connected between the supply terminal 224 and opto couplers IC 1 and IC 2 and to the gate electrode of a field effect transistor TR1. A resistor R4 is connected between the terminal 224 and the drain electrode of transistor TR1 while the source electrode of transistor TR1 is connected to the ground terminal 225. The drain electrode of transistor TR1 is connected to an output terminal 226 for connection to the processor 203. Thus if an unauthorised voltage is detected on the load side of the contactor 205, when the contactor is open, the signal on output 226 of the reverse power lockout circuit will indicate to the processor that the contactor should not be closed regardless of any other message that the processor may have received.

The over air protocol/message structure is designed to provide a high level of security to expand to the allowable FLEXJ address range with the inclusion of sub-addresses, to reduce false activation to a minimum level, to provide a high level of corrupt message detection, and to provide a flexible structure for future expansion. The message structure comprises a check sum of six ASCII characters a sub-address of eight ASCII characters, and a command message which has a variable length string of ASCII characters. The allowable characters within the message structure are that the preceding check sum will range between 30 and 3Fhex and consist of six ASCII characters. Sub-address characters will range between 20 and 7Ehex and consist of eight ASCII characters. All characters used within the command message are printable ranging between 20 and 7Ehex. The length of the command message is variable.

Each controller will contain 2 sub-addresses, one for a individual address and one for a group address. The sub-address may be considered as a password over and above the normal FLEXJ paging RIC/CAP code address. This sub-address consists of eight ASCII characters (even if spaces are used to maintain the structure). Any printable characters may be used and the sub-address is case sensitive. The primary (individual sub-address) is designed as an address that is unique to a device. The secondary (group sub-address) is designed to be common amongst a group of devices. This secondary address may be changed over the air. This can only be achieved by sending the appropriate command message to the primary sub-address. This is designed to allow mass control of devices from a group transmission and the possibility of an individual device to be programmed over the air to change groups. If no secondary address is required, then the secondary address may be set to be the same as the primary address.

The command message is a variable length string of characters used to identify the command that is to be carried out. All characters are case sensitive. The following table lists a number of over-the-air commands.

| COMMAND | DESCRIPTION |
| --- | --- |
| O | Open the switch |
| A | Arm the switch |
| C | Close the switch |
| A/C | Arm and close the switch (in one go) |
| L00 | Clear any current limit |
| L05 | Set current limit to 5 Amps |
| L10 | Set current limit to 10 Amps |
| L15 | Set current limit to 15 Amps |
| L20 | Set current limit to 20 Amps |
| L25 | Set current limit to 25 Amps |
| L30 | Set current limit to 30 Amps |
| TEST = [Plain text message] | Send a text message to a terminal connected to P001/C |
| NC = New Sub Address | Changes secondary sub address to new one specified (8 Characters) |

The message structure includes a check sum which is employed in addition to the standard FLEXJ error detection and correction to help prevent accidental or malicious false decoding of messages. This does cause reception to be less good than a stand alone pager where no check sum has been used. The message has to be received without any errors in it to be acted upon. Thus, the number of times a message does not get through will be increased. This may be compensated for by transmitting a given message a number of times, the number being selected to take into account the likelihood of a message being correctly received. It will be appreciated that there is no return message to the server to acknowledge receipt of any command message. Consequently, it is desirable to transmit any given message a sufficient number of times to give confidence that a message will have been received by the controller to which it was addressed.

The check sum precedes all messages and contains six ASCII characters ranging from 20–2Fhex. The numerical value of these characters is based upon the message content so each sub address and command will generate different check sum values. In addition the check sum algorithm has been arranged to maximise unique results in cases of typical burst errors such as are encountered via asynchronous wireless data links. The six check sum characters are calculated as follows:

First step—add together the ASCII value of each odd character position starting with the first character of the sub-address within the entire message string and including the command string.

Second step—truncate the result to 12 binary bits if necessary (FFFhex).

Third step—stating with the most significant nibble of the 12 bit value calculated in Step 2, function OR this value to 30hex after bit shifting the nibble to the least significant position.

Fourth Step—this is the ASCII value of the first check sum value character.

Fifth Step—Repeat the process from Step 3 from the last two nibbles function ORing the nibbles with 30hex.

Sixth Step—This produces the first three check sum characters.

Seventh Step—add together the ASCII value of each even character position starting with the first character of the sub-address within the entire message string and including the command string.

Eighth Step—Truncate the result to 12 binary bits if necessary (FFF hex)

Nineth Step—repeat the process from Step 3 for the last three check sum characters.

The final result is a six character string each character being in the ASCII range 30 to 3F hex.

This then forms the six check sum characters which precede the sub-address and command message character strings.

The over air command message may be surrounded by additional characters. The decoder is arranged to be able to select a valid message from within a wider message sent by the paging system. Some paging systems add a message counter or time signal to the transmitted message and these can be put on either the beginning or end of the original message. The decoder achieves the selection of a valid message by using a sliding window which it uses to check for a valid sub address. Once it has seen this the software checks for a command message and a valid check sum. The sliding window is obtained by the decoder repeatedly advancing by one character in the received message and checking at each advance for a valid sub address within a window of twenty four characters. The width of the window will of course depend on the maximum number of characters within a message.

Figure 19:
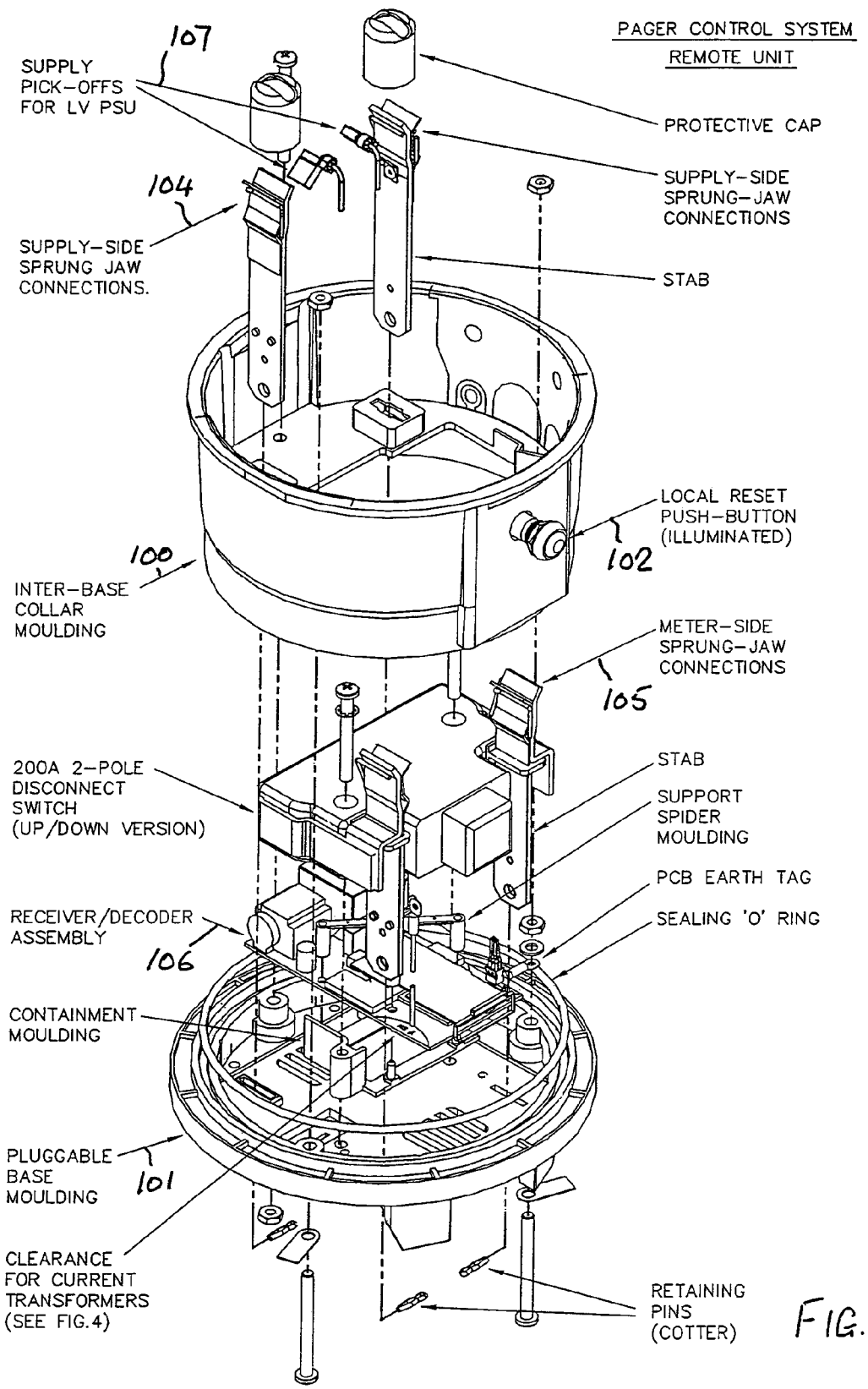
FIG. 19 is an exploded view of the adapter shown in FIG. 18.

FIGS. 18 and 19 illustrate the mechanical arrangement of the controller within a meter adapter arranged for location between a supply socket a meter. The controller is housed within an adapter which comprises an interbase collar moulding 100 and a plugable base holding 101. The interbase collar moulding 100 is provided with a local reset button 102 which is illuminated. A 200 amp 2-pole disconnect switch 103 is arranged to connect between the supply side sprung jaw connections 104 and meter side sprung jaw side connections 105, under the control of the controller. The receiver decoder assembly 106 is located between the base moulding 101 and the disconnect switch 103. The 2-pole disconnect switch or power latching relay may be as described in WO03/049129A1 or WO 03/046936 A1. The disconnect switch 103 is integrated into the meter adapter with the provision of robust spring jaws 104, 105 for plugging the demounted meter back into the meter base socket for normal resumed operation. The paging receiver and controller electronics is contained within the meter adapter between its base and the disconnect switch and derives its low voltage supply 107 from the two phase (230V AC) utility connection within in the base.

The server, paging system transmission, and remote controllers allow normal residential disconnect and reconnect control to be effected remotely by the utility company or via a central server provided by a third party. Other applications such as load management can also be effected. Utility companies offer users potential savings in their energy costs if allowance is given for time variable supply—that is guaranteeing the same energy supplied over a 24 hrs period but at times to suit the utility. This can enable supply demands to be smoothed out, reducing the likelihood of power cuts if maximum demand is exceeded at peak times. It is clearly advantageous if non sensitive loads can be disconnected first in order to reduce the necessity for total house disconnection. A specific example of time variable supply is that used for swimming pool heating. Customer premises can have a second controlled meter specifically for this purpose enabling remote control of pool heating periods at the discretion of the utility company.

Remote disconnection of a customer=s premises provides utility companies with a powerful revenue collection tool which reduces operational costs. For example, a bad payer can be remotely disconnected after warnings relating to habitual non payment have been issued. The financial advantages of remote service disconnect/reconnect are clear and the control system can enable this to be achieved in a cost effective manner. Clearly remote disconnect has advantages over the utility having to send out an employee to a customer=s premises to disconnect the customer both from the point of view of minimising journeys by employees and from the personal safety point of employees. Irate customers can become violent and/or may bar access to the employee to disconnect the supply.

Another function which may be implemented is the remote current limiting of the load rather than total or prolonged disconnection. A customer who has a large payment arrears can be remotely prevented from excessive energy use by limiting the permitted load they can draw from the supply. If the customer exceeds the permitted preset current, the system can automatically disconnect the supply and automatically reconnect after a predetermined time delay, which is preset or programmable remotely. Many utilities have a duty to provide electricity to premises but may provide it at a controlled lower restricted level. The particular statutory duty varies from State to State in the USA particularly in colder winter months when a basic level of comfort/survival energy supply is necessary To achieve this form of control the controller is fitted with two current transformers which monitor the nominal energy usage in both phases. Measurement does not need to be as precise as that used in the meter. The normal current limit is preset at manufacture or burnt into the controller software on initialisation. However, the message structure includes additional commands relating to the current limit and the database may contain the locations of bad payers who could be current limited at the discretion of the utility company. The specific current limit is controlled by a command message which controls the current level at which the unit will disconnect. Clearly this current limitation can be removed at any time and full unlimited supply enabled by sending the appropriate command message to the controller.

It will be seen from FIG. 19 that the unit is provided with a local reset push button. Following a disconnection there are two options that can be programmed into the controller for resetting the remote disconnect relay contactor 103. Re-connection can be achieved with no customer intervention by sending a reset command directly over the pager network or the control unit can be armed remotely with the final reset being achieved by the customer pressing a local illuminated push button 102 on the unit. The LED in the push button 102 can be illuminated by means of an output from the processor 203 in the controller when the reset push button is enabled.

The controller is arranged so that it is able to close automatically the power switch contacts and reconnect the service a preset period of time after having disconnected it. Whether this feature is activated and the amount of time for which the contacts will remain open, can be preset within the unit by programming and remotely controlled by a command message which programmes the amount of time, for example in minutes, for which the service may be disconnected. This feature will normally be applied in conjunction with the load limiting feature described above.

The controller is capable of being programmed with two identifiers that can either be unique to the individual unit or be common to a group of units. In this way a single command message transmitted over the paging network, may control a large number of individual units simultaneously. To facilitate dynamic control of the groups to which an individual unit may belong, and may be controlled by, there is a facility to programme to secondary identifier for the unit from a command message. This message is sent in the same way as regular commands and is subject to the same check sum protection.

The system allows a utility company to individually connect any customer to the supply using individual controllers coupled to the supply socket on the customer=s premises and perform a disconnection or re connection remotely. The control software operates on a stand alone personal computer or a utility workstation and is able to import existing customer records onto its database using a comma separated value file. The software at the systems data centre or server contains a customer database which hold details of all controllers including their location and the related switch status whether closed or open. The utility can search for a customer using multiple user defined and standard controllers in the field. Once the customer controller has been located and identification confirmed, a control instruction can be sent to the controller. The software generates the appropriate coded message and sends it to the designated paging service provider via the PC or workstation modem. The message is then transmitted over the paging network to the controller for decoding and appropriate control action.

As shown in FIGS. 18 and 19, the controller is contained within a UL414 approved meter adapter mounted between a demountable meter and the supply socket. Once the system is inserted in the meter installation, there are no control wires or cable runs to connect. While mounting the controller in a meter adaptor is convenient, it would alternatively be possible to construct a meter housing the controller as a single integrated unit.

FIGS. 18 and 19 show the basic parts of the controller which are integrated inside an interbase collar moulding. The inter base collar moulding is closed at the end that mates with the supply socket by a plugable base moulding which is provided with copper stab connections below and sprung jaw meter connections above. A heavy duty disconnect switch is mounted on the base within the collar and the controller electronics, including the receiver and decoder driver printed circuit boards, is located below the switch. The interbase collar is a plastic moulding so there is no loss of sensitivity in the receiver. The heavy duty disconnect switch is in effect, interposed between the meter and the utility plugable socket. There are two supply side direct sprung jaws with stabs above the switch into the which the meter connects directly, for providing its two phase supply and current monitoring energy measurement. The configured switch is a so called up down type, having stabs below for plugging into the base socket and sprung jaws vertically above on the same centres for the meter return connections to the switched external load. All four stabs are retained by suitable (cotter) split pins within the base moulding exit slots. The centres of the four stab connections are standardised for North American metering systems. The local reset push button is mounted on the collar moulding and contains an LED that indicates when the manual reconnect feature is armed, that is when depression of the manual reset button is effective to restore the supply by causing the power switch to close.

What is claimed is:

1. A remotely controlled controller for an electricity supply contained within at least one of meter and an adapter arranged to be mounted between a demountable meter and a supply socket, the controller comprising:
 a temperature compensated paging receiver;
 a decoder for decoding control messages received via the paging receiver;
 at least one of the paging receiver and the decoder having a unique address identifying an individual controller;
 a power switch for connecting power between the supply socket and a load; and
 a control arrangement for receiving decoded messages from the decoder and arranged to act upon control instructions included in decoded control messages to cause the power switch to connect or disconnect the supply socket to and from the load: wherein said messages have a format of a first set of ASCII check sum characters, followed by a second set of ASCII sub address characters, and a third set of ASCII command message characters.

2. A controller as claimed in claim 1 in which said first set comprises six characters.

3. A controller as claimed in claim 1 in which the second set comprises eight characters.

4. A controller as claimed in claim 1 in which said third set is a variable length string of characters.

5. A controller as claimed in claim 1 further comprising a reverse power lockout circuit arranged to monitor voltage on the load side of the power switch when the switch is open and inhibit closing of the power switch when a voltage above a given threshold is detected.

6. A controller as claimed in claim 5 in which the command message characters are alpha numeric characters.

7. A controller as claimed in claim 5 arranged to receive messages containing instructions to alter conditions set within the controller and to act upon those altered instructions.

8. A controller as claimed in claim 7 in which the command message characters are alpha numeric characters.

9. A controller as claimed in claim 6 further comprising a manual reset switch accessible outside the controller for resetting the power switch.

10. A controller as claimed in claim 9 in which operation of the manual reset switch is enabled by received messages.

11. A controller as claimed in claim 5 further comprising a manual reset switch accessible outside the controller for resetting the power switch.

12. A controller as claimed in claim 11 in which operation of the manual reset switch is enabled by received messages.

13. A controller as claimed in claim 7 further comprising a manual reset switch accessible outside the controller for resetting the power switch.

14. A controller as claimed in claim 13 in which operation of the manual reset switch is enabled by received messages.

15. A controller as claimed in claim 13 in which the command message characters are alpha numeric characters.

16. A controller as claimed in claim 15 in which operation of the manual reset switch is enabled by received messages.

17. A controller as claimed in claim 1 in which the command message characters are alpha numeric characters.

18. A controller as claimed in claim 17 arranged to receive messages containing instructions to alter conditions set within the controller and to act upon those altered instructions.

19. A controller as claimed in claim 17 further comprising a manual reset switch accessible outside the controller for resetting the power switch.

20. A controller as claimed in claim 19 in which operation of the manual reset switch is enabled by received messages.

21. A controller as claimed in claim 18 further comprising a manual reset switch accessible outside the controller for resetting the power switch.

22. A controller as claimed in claim 21 in which operation of the manual reset switch is enabled by received messages.

23. A controller as claimed in claim 1 arranged to receive messages containing instructions to alter conditions set within the controller and to act upon those altered instructions.

24. A controller as claimed in claim 23 further comprising a manual reset switch accessible outside the controller for resetting the power switch.

25. A controller as claimed in claim 24 in which operation of the manual reset switch is enabled by received messages.

26. A controller as claimed in claim 1 further comprising a load current measuring arrangement, wherein when a load current greater than a preset value is detected by the load current measuring arrangement, the controller is arranged to open the power switch for a preset period.

27. A controller as claimed in claim 26 in which the command message characters are alpha numeric characters.

28. A controller as claimed in claim 26 arranged to receive messages containing instructions to alter conditions set within the controller and to act upon those altered instructions.

29. A controller as claimed in claim 27 further comprising a manual reset switch accessible outside the controller for resetting the power switch.

30. A controller as claimed in claim 29 in which operation of the manual reset switch is enabled by received messages.

31. A controller as claimed in claim 29 arranged to receive messages containing instructions to alter conditions set within the controller and to act upon those altered instructions.

32. A controller as claimed in claim 30 arranged to receive messages containing instructions to alter conditions set within the controller and to act upon those altered instructions.

33. A controller as claimed in claim 26 arranged to receive messages containing instructions to alter conditions set within the controller and to act upon those altered instructions.

34. A controller as claimed in claim 1 further comprising a manual reset switch accessible outside the controller for resetting the power switch.

35. A controller as claimed in claim 34 in which operation of the manual reset switch is enabled by received messages.

36. A controller as claimed in claim 26 further comprising a manual reset switch accessible outside the controller for resetting the power switch.

37. A controller as claimed in claim 36 in which operation of the manual reset switch is enabled by received messages.

38. A controller as claimed in claim 36 arranged to receive messages containing instructions to alter conditions set within the controller and to act upon those altered instructions.

39. A controller as claimed in claim 37 arranged to receive messages containing instructions to alter conditions set within the controller and to act upon those altered instructions.

40. A controller as claimed in claim 1, in which the control arrangement extracts the control instructions from the decoded messages by means of a sliding window.

41. A system for remotely controlling the supply of electric power to customer premises comprising:
- a central control computer programmed to produce control instructions for transmission to a controller contained within at least one of a meter and an adapter located between a supply socket and a demountable meter at each customer's premises, each controller having at least one of a unique identifier and belonging to a group with a single common unique identifier;
- wherein the central control computer is programmed to produce a command message having a format of a first set of ASCII check sum characters, followed by a second set of ASCII sub address characters, and third set of ASCII command message characters, and
- a paging system for transmitting the command message from the central control computer to each controller; wherein each controller comprises a temperature compensated paging receiver, a decoder for decoding command messages addressed to that controller, a switching arrangement for connecting the supply socket to and from a load, and a control arrangement for receiving control messages from the decoder and arranged to act upon the instructions to cause the switching arrangement to connect or disconnect the supply socket to/from the load.

42. A system as claimed in claim 41 in which the first set comprises six characters.

43. A system as claimed in claim 41 in which the second set comprises eight characters.

44. A system as claimed in claim 41 in which the third set is a variable length string of characters.

45. A system as claimed in claim 42 in which the second set comprises eight characters and the third set is a variable length string of characters in which the check sum is calculated according to a method having the following steps:
- A) add together the ASCII value of each odd character position starting with the first character of the second set and continuing to the end of the third set,
- B) truncate the result to 12 binary bits if necessary (FFF hex),
- C) starting with a most significant nibble of the 12 bit value calculated in Step b), function OR this value to 30 hex after bit shifting the nibble to the least significant position to produce the first check sum character,
- D) repeat the step c) for the last two nibbles to produce the second and third check sum characters,
- E) add together the ASCII value of each even character position starting with the first character of the second set and continuing to the end of the third set,
- F) truncate the result to 12 binary bits if necessary (FFFhex),
- G) repeat steps c) and d) using the result from step f) instead of step b) to produce the final three characters of the check sum.

46. A system as claimed in claim 41 in which the command message is transmitted more than once to each controller.

47. A message structure for sending commands to a remote controller, the message structure comprising a first set of six ASCII check sum characters, followed by a second set of ASCII sub address characters, and third set of ASCII command message characters, and in which the second set comprises eight characters and the third set is a variable length string of characters in which the check sum is calculated according a method having the following steps:
- A) add together the ASCII value of each odd character position starting with the first character of the second set and continuing to the end of the third set,
- B) truncate the result to 12 binary bits if necessary (FFF hex),
- C) starting with a most significant nibble of the 12 bit value calculated in Step b), function OR this value to 30 hex after bit shifting the nibble to the least significant position to produce the first check sum character.
- D) repeat the step c) for the last two nibbles to produce the second and third check sum characters,
- E) add together the ASCII value of each even character position starting with the first character of the second set and continuing to the end of the third set,
- F) truncate the result to 12 binary bits if necessary (FFFhex),
- G) repeat steps c)and d)using the result from step f)instead of step b)to produce a final three characters of the check sum.

* * * * *